United States Patent
Lin et al.

(10) Patent No.: US 7,667,289 B2
(45) Date of Patent: Feb. 23, 2010

(54) FUSE STRUCTURE HAVING A TORTUOUS METAL FUSE LINE

(75) Inventors: Jian-Hong Lin, Yunlin (TW);
Kang-Cheng Lin, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 28 days.

(21) Appl. No.: 11/091,508

(22) Filed: Mar. 29, 2005

(65) Prior Publication Data

US 2006/0226507 A1    Oct. 12, 2006

(51) Int. Cl.
*H01L 21/326* (2006.01)
(52) U.S. Cl. ............... 257/529; 257/E21.149; 257/E23.15; 438/467
(58) Field of Classification Search .......... 257/592, 257/529, 530, E21.149, E23.15; 438/467
See application file for complete search history.

(56) References Cited

U.S. PATENT DOCUMENTS

| | | | | |
|---|---|---|---|---|
| 5,780,918 A | * | 7/1998 | Aoki | 257/529 |
| 5,808,351 A | * | 9/1998 | Nathan et al. | 257/528 |
| 6,133,054 A | * | 10/2000 | Henson | 438/17 |
| 6,255,715 B1 | | 7/2001 | Liaw | |
| 6,518,642 B2 | | 2/2003 | Kim et al. | |
| 6,573,585 B2 | * | 6/2003 | Arndt et al. | 257/529 |
| 6,586,815 B2 | * | 7/2003 | Ohhashi | 257/529 |
| 6,753,210 B2 | * | 6/2004 | Jeng et al. | 438/132 |
| 2002/0060350 A1 | * | 5/2002 | Schulte et al. | 257/530 |

\* cited by examiner

*Primary Examiner*—Wael Fahmy
*Assistant Examiner*—John C Ingham
(74) *Attorney, Agent, or Firm*—Muncy, Geissler, Olds & Lowe, PLLC

(57) ABSTRACT

A laser fuse structure for a semiconductor device, the laser fuse structure having an array of laser fuses wherein one or more of the fuses in the array have a tortuous fuse line extending between first and second connectors that connect the fuse to an underlying circuit area.

17 Claims, 5 Drawing Sheets

FUSE STRUCTURE HAVING A TORTUOUS METAL FUSE LINE

FIELD OF INVENTION

The present invention relates generally to integrated circuits and semiconductor devices, and more particularly to laser fuses and laser fuse structures for repairing and reconfiguring integrated circuits.

BACKGROUND

Laser fuses may be used to rewire semiconductor memory and logic circuits. For example, in dynamic or static memory chips, defective memory cells may be replaced by blowing fuses associated with the defective cells, and activating a spare row or column of cells. This circuit rewiring using fusible links allows considerable enhanced yields and reduces the production costs. Also, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

As shown in FIG. 1, a conventional laser fuse structure 10 typically includes one or more laser fuses 20. The fuse 20 conventionally includes a straight metal fuse line 21 extending through an inter-metal-dielectric (IMD), between block-like metal connector structures 22a and 22b. The block-like metal connector structures 22a and 22b enable the fuse line 21 of the fuse 20 to be electrically connected to one or more circuits disposed below the fuse 20. The one or more circuits connected to the fuse 20 may be modified or altered (e.g., reconfigured or repaired) by vaporizing a section 21a of the metal fuse line 21 (FIG. 2A) with a high energy laser to create an open 23 in the fuse line 21 as shown in FIG. 2B. The open 23 is defined by a trench 31 in the IMD 30 where the vaporized metal fuse line section 21a was disposed.

A major problem with the laser fuse 20 is that when the section 21a of the straight fuse line 21 is vaporized, the trench 31 in the IMD 30 left by the open 23 in the fuse line 21 provides a short and direct diffusion path 40 for metal atoms between opposing end portions 24a and 24b of the open fuse line 21 as shown in FIG. 2C. The short and direct diffusion path 40 allows the metal atoms of the opposing end portions 24a ad 24b of the open fuse line 21 to quickly migrate (reflow) toward one another during post-anneal reliability testing and evaluation. If the laser energy utilized in the fuse blowing process is not high enough, the fuse line end portions 24a and 24b may re-connect with one another causing the repaired device to fail again. If the laser energy utilized in fuse blowing process is sufficiently high to avoid metal atom reflow, the inter-metal-dielectric IMD 30 adjacent to the fuse line 21 may crack due to the extreme thermal expansion of the IMD 30 during the fuse opening process.

Accordingly, a laser fuse structure for repairing and reconfiguring integrated circuits is needed that substantially eliminates the metal reflow and IMD cracking problems of current laser fuse structures.

SUMMARY

A fuse or an array of fuses for a semiconductor device, wherein one or more of the fuses comprises first and second connectors; and a tortuous fuse line extending between the first and second connectors.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

Figure 3:
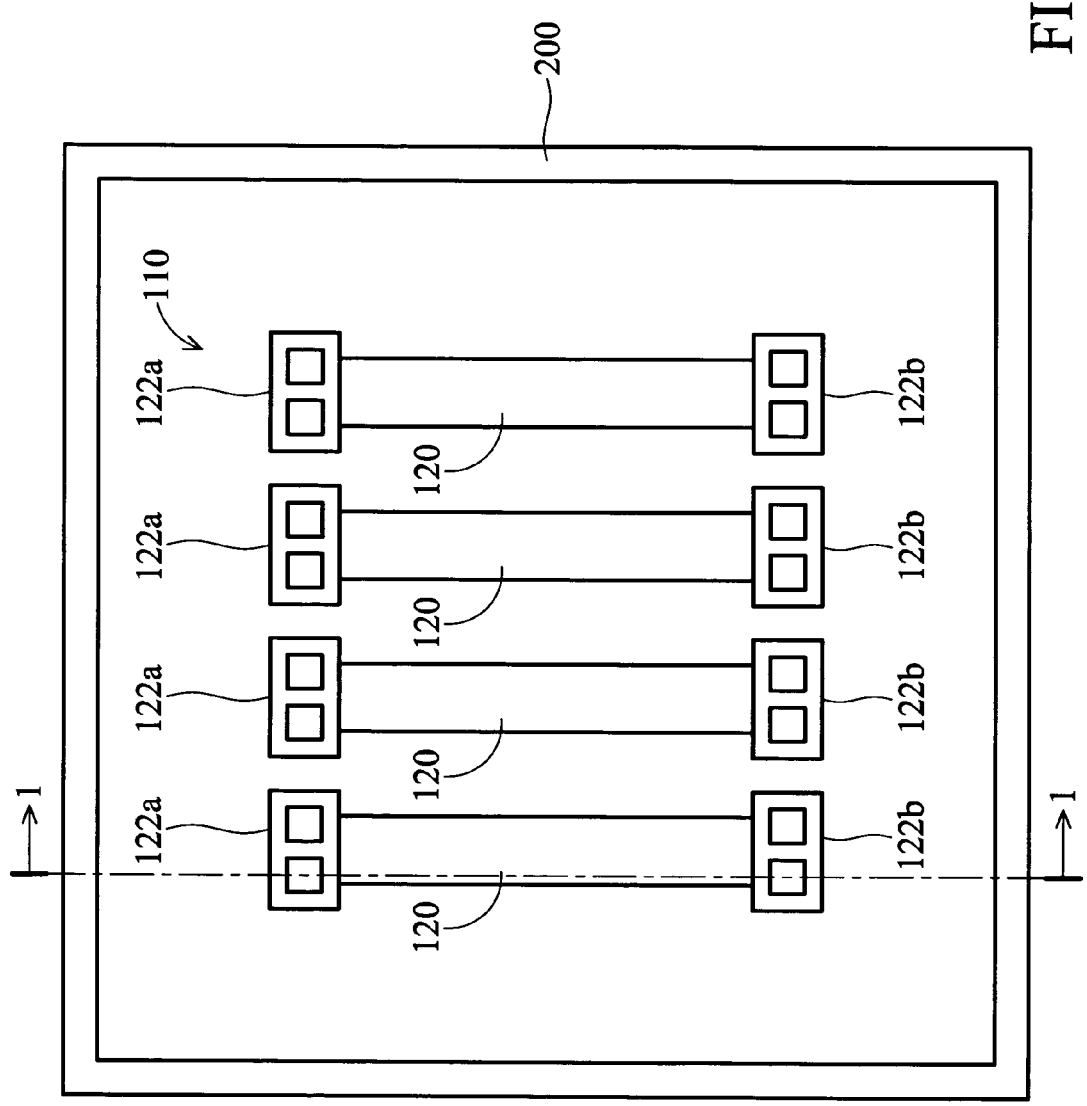
FIG. 3 is a top plan view of an exemplary embodiment of a laser fuse structure enclosed in a guard ring structure according to principles of the present invention.

FIG. 3 is a top plan view of an exemplary embodiment of a laser fuse structure 110 and a guard ring structure 200 according to principles of the present invention. The laser fuse structure 110 may be used for many purposes including, for example rewiring semiconductor memory and logic circuits and repairing and/or reconfiguring integrated circuits. The embodiment of the laser fuse structure 110 shown in FIG. 3 comprises an array of discrete laser fuses 120 that extend substantially parallel with one another. In other embodiments, the laser fuse structure may comprise a single laser fuse 120. Each of the laser fuses 120 includes a tortuous metal fuse line (not shown) extending between a first pair of metal block-like connector structures 122a and 122b that are typically disposed in the same metal level as the fuse line. Tortuous metal fuse line may be formed of a metal, such as copper or aluminum for example. Surrounding laser fuse structure 110 is a guard ring structure 200 which blocks moisture and contamination from diffusing through the device areas, including the fuse window area, thus improving device reliability and yields.

Figure 4:
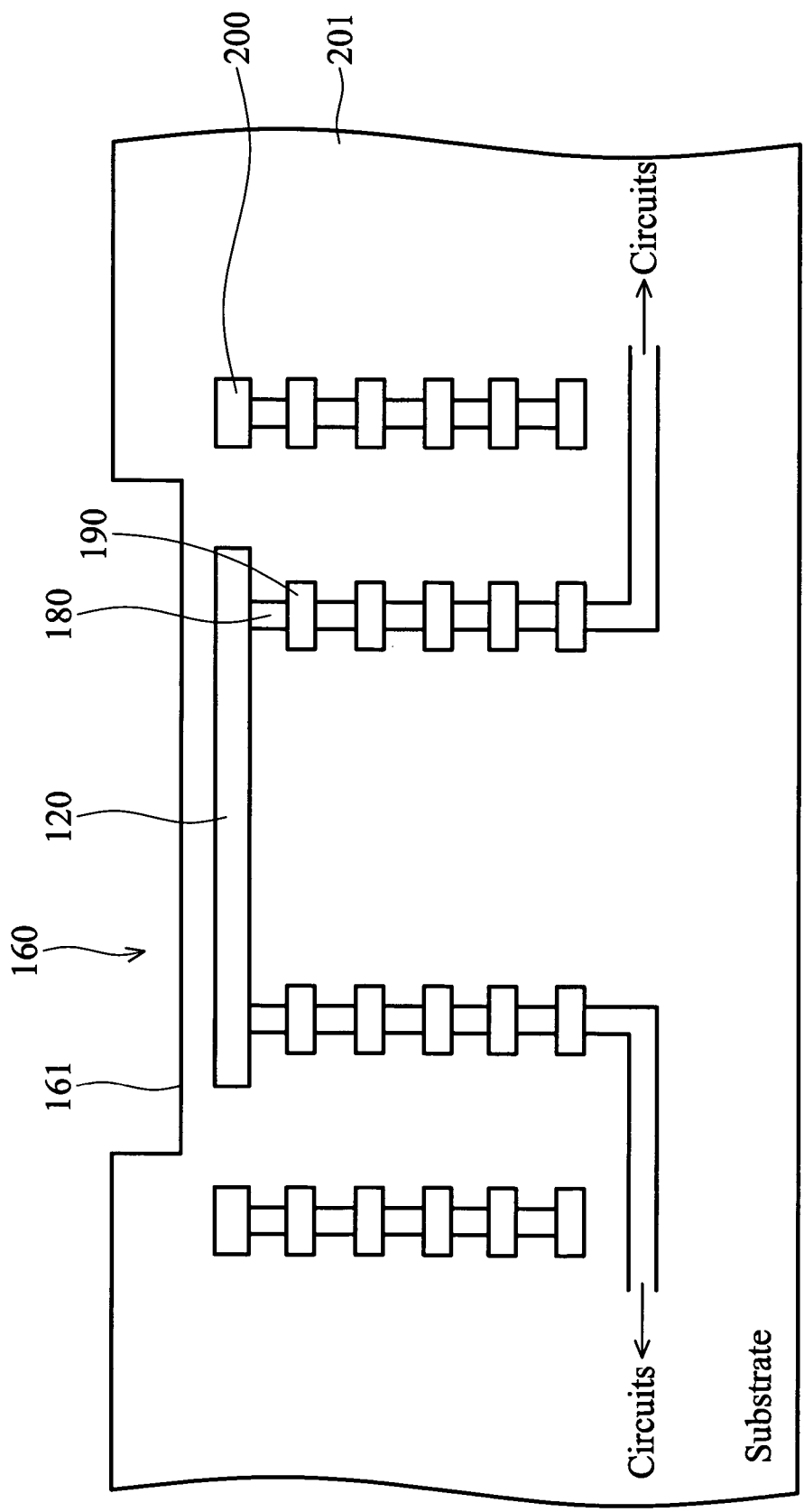
FIG. 4 is a sectional view along the axis 1 of the laser fuse structure of FIG. 3.

FIG. 4 is a sectional view taken along the axis 1 of the laser fuse structure of FIG. 3. Under each block-like metal connector structures 122a and 122b is a plurality of vias 180 and metal islands 190 and the block-like metal connector structures 122a and 122b are respectively connected to metal islands 190 in lower metal levels by vias 180. The vias 180 and metal islands 190 extend in one or more dielectric material layers 201 of varying thicknesses and compositions, such as, for example silicon oxide to electrically connect the fuses 120 to associated circuits formed in underlying circuit areas (not shown). A trench 160 typically extends through a top passivation layer (not shown) and one or more dielectric material layers 201 in an area immediately above the array of laser fuses 120. The bottom wall of the trench 160 defines a fuse window 161. FIG. 4 also shows the guard ring structure 200 surrounding the fuse window 161 to prevent moisture and contamination from diffusing from the fuse window 161 to the devices therebelow.

Figure 1:
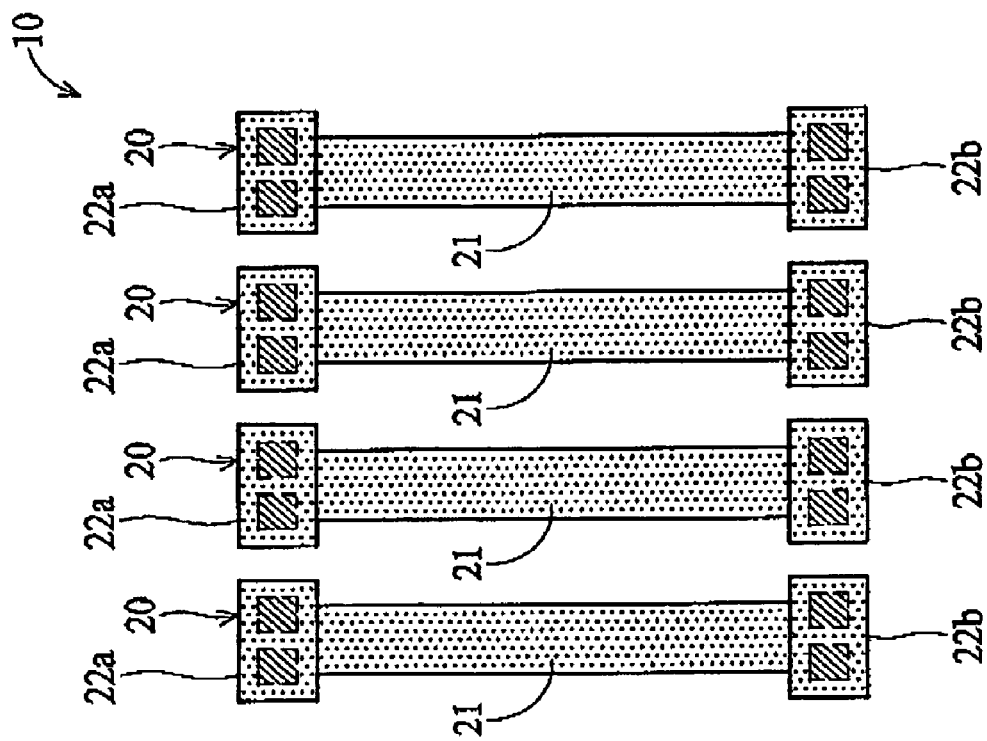
FIG. 1 is a top plan view of a prior art laser fuse structure.
Figure 2C:
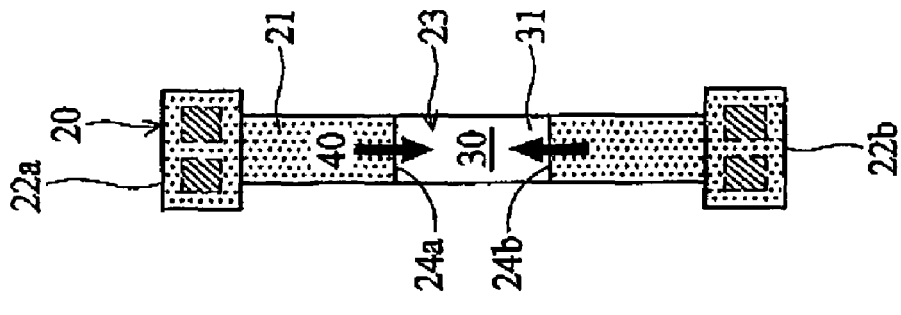
FIG. 2C is a top plan view of the prior art fuse of FIG. 2B illustrating the straight prior art diffusion path that occurs after post-anneal reliability testing and evaluation.
Figure 2B:
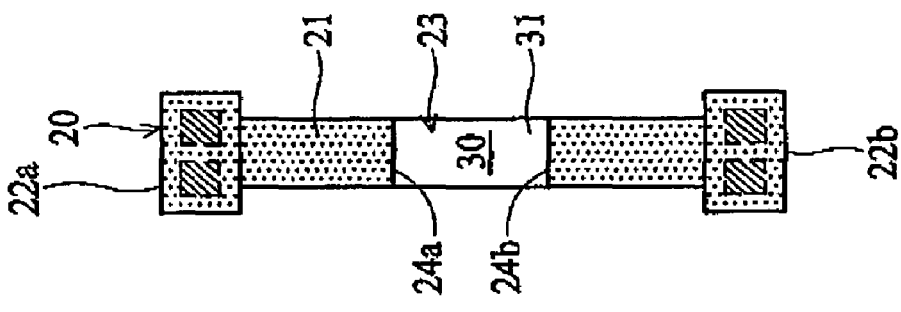
FIG. 2B is a top plan view the prior art fuse of FIG. 2A after lasing.
Figure 2A:
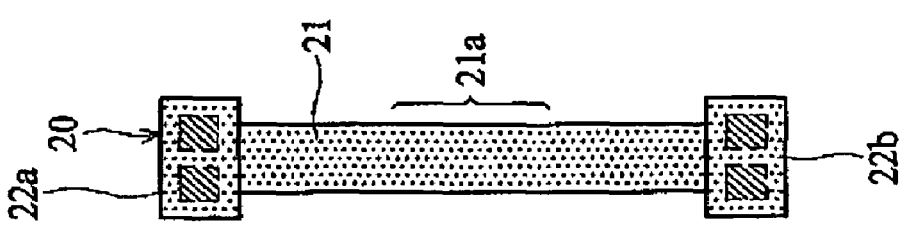
FIG. 2A is a top plan view of one of the fuses of the prior art fuse structure of FIG. 1 before lasing.
Figure 5C:
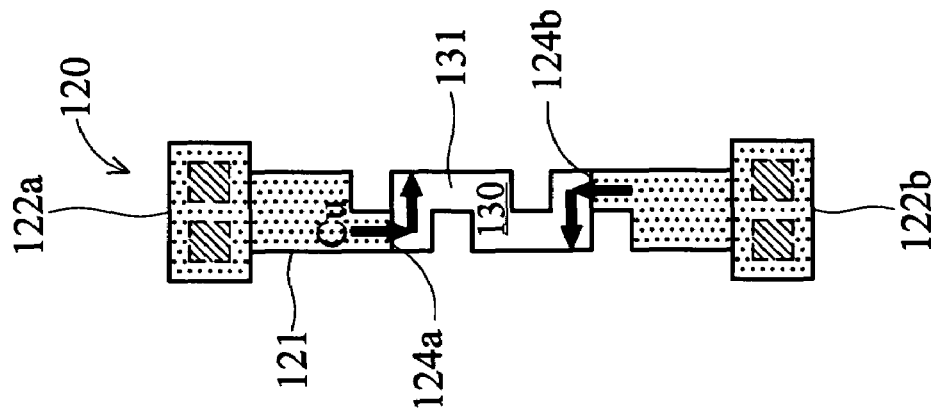
FIG. 5C is a top plan view of the fuse of FIG. 5B illustrating the tortuous diffusion path that results after post-anneal reliability testing and evaluation.
Figure 5B:
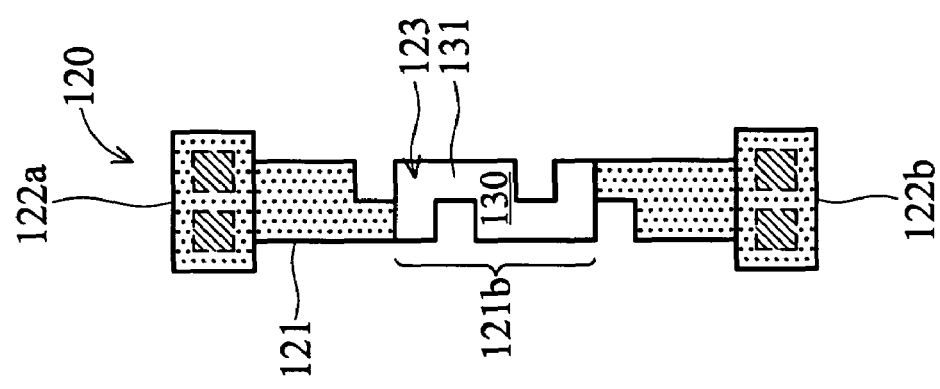
FIG. 5B is a top plan view of the fuse of FIG. 5A after lasing.
Figure 5A:
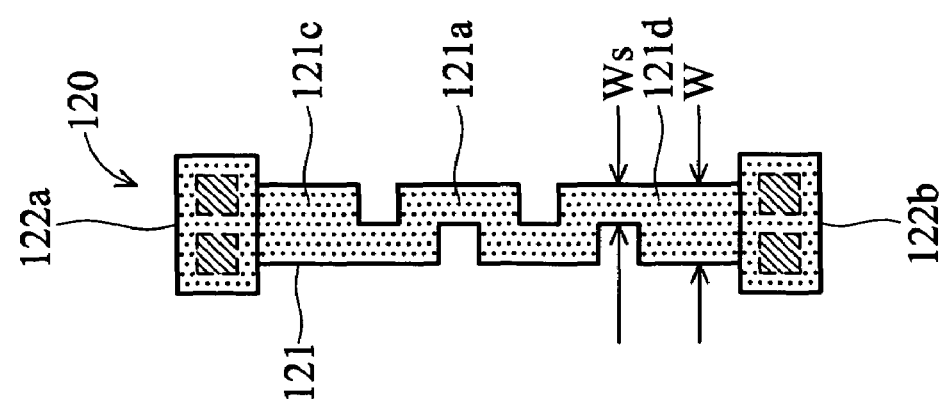
FIG. 5A is a top plan view of one of the fuses of the fuse structure of FIG. 3 before lasing.

Referring to FIG. 5A, a tortuous metal fuse line 121 or at least a portion thereof extends in a substantially tortuous manner to define, without limitation, a symmetrical (as shown) or asymmetrical serpentine-shape, saw-shape, winding-shape, curved-shape, sinuous-shape, and/or twisted-shape segment 121a. In the shown embodiment, the tortuous segment 121a of the fuse line 121 has a width Ws which is less than the width W of the conventional fuse line of FIG. 1 or the width of non-tortuous segments 121c and 121d of the fuse line 121.

The circuits and circuit routings associated with each of the fuses 120 may be reconfigured, repaired, etc., by vaporizing their associated fuse's metal fuse line 121 with a high energy laser to create an open 123 in a section 121b of the serpentine segment 121a as shown in the plan view of FIG. 5B. The open 123 where the vaporized tortuous metal fuse line section 121b was disposed leaves behind a correspondingly tortuous trench 131 in the IMD 130.

The tortuous trench 131 remaining in the IMD 130 after lasing substantially eliminates the metal reflow and IMD cracking problems of conventional laser fuse structures, which utilize laser fuses with conventional straight line metal fuse lines. As can be seen in FIG. 5C, the metal reflow problem is substantially eliminated because the tortuous trench 131 has a winding and longer metal atom diffusion path P that makes it more difficult for the metal atoms to diffuse and migrate toward one another from the ends 124a and 124b of the fuse line 121 during post-anneal reliability testing and evaluation. Furthermore, the IMD cracking problem is substantially eliminated because the tortuous laser fuse line 121 (the segment 121a in the shown embodiment) has a lower metal-to-IMD volume ratio (due to the reduced width Ws of the fuse line 121) and a greater metal/IMD interface area (due to the serpentine shape which lengthens the diffusion path P) than the conventional straight shape metal fuse line. The lower metal-to-IMD volume ratio and greater metal/IMD interface area enhances the heat absorption capability of the fuse line 121 in the laser blowing process.

The laser fuse 120 can be fabricated using conventional integrated circuit and semiconductor fabrication methods, which are very well known to persons skilled in the art. The tortuous metal fuse line 121, the block-like connectors 122a, 122b, 170a, 170b and vias 171 can be formed of metals, metal alloys or polysilicon including, for example, copper, aluminum, tungsten, titanium nitride, and silicides.

While the foregoing invention has been described with reference to the above, various modifications and changes can be made without departing from the spirit of the invention. Accordingly, all such modifications and changes are considered to be within the scope of the appended claims.

What is claimed is:

1. A fuse for a semiconductor device, the fuse comprising:
   first and second connectors; and
   a fuse line extending between the first and second connectors, wherein the first and second connectors are disposed in the same level as the fuse line, and the fuse line comprises a tortuous region to be blown with two ends used for providing a longer diffusion path than a distance between the two ends of the tortuous region to be blown when all the tortuous region to be blown is removed to form a tortuous trench, all the tortuous region to be blown has a constant reduced width, compared to non-tortuous segments.

2. The fuse according to claim 1, wherein the fuse line has a shape selected from the group consisting of serpentine, saw, winding, curved, sinuous, and twisted.

3. The fuse according to claim 1, wherein the connectors are for connecting the fuse to an underlying circuit area.

4. The fuse according to claim 1, wherein the fuse line extends through a dielectric layer.

5. The fuse according to claim 4, wherein removal of the tortuous region to be blown of the fuse line by a laser leaves the tortuous trench in the dielectric.

6. The fuse according to claim 1, wherein the fuse line is formed of at least one of a metal or a metal alloy.

7. The fuse according to claim 1, wherein the first and second connectors are each formed of at least one of a metal, metal alloy and polysilicon.

8. The fuse according to claim 1, further comprising a fuse window disposed above the fuse.

9. The fuse according to claim 1, wherein the fuse comprises a laser fuse.

10. A fuse structure for a semiconductor device, the fuse structure comprising:
    an array of fuses, at least one of the fuses in the array comprising:
    first and second connectors; and
    a fuse line extending between the first and second connectors, wherein the first and second connectors are disposed in the same level as the fuse line, and the fuse line comprises a tortuous region to be blown with two ends used for providing a longer diffusion path than a distance between the two ends of the tortuous region to be blown when all the tortuous region to be blown is removed to form a tortuous trench, all the tortuous region to be blown has a constant reduced width, compared to non-tortuous segments.

11. The fuse structure according to claim 10, wherein the fuse line has a shape selected from the group consisting of serpentine, saw, winding, curved, sinuous, and twisted.

12. The fuse structure according to claim 10, wherein the connectors are for connecting the fuse to an underlying circuit area.

13. The fuse structure according to claim 10, wherein the fuse line extends through a dielectric.

14. The fuse structure according to claim 13, wherein removal of the tortuous region to be blown of the fuse line by lasing leaves the tortuous trench in the dielectric.

15. The fuse structure according to claim 10, wherein the fuse line is formed of at least one of a metal or metal alloy.

16. The fuse structure according to claim 10, wherein the first and second connectors are each formed of at least one of a metal, metal alloy and polysilicon.

17. The fuse structure according to claim 10, further comprising a fuse window disposed above the array of fuses.

* * * * *